(12) United States Patent
Chen et al.

(10) Patent No.: US 8,593,184 B2
(45) Date of Patent: Nov. 26, 2013

(54) BUFFER CIRCUIT WITH REGULATING FUNCTION AND REGULATING CIRCUIT THEREOF

(75) Inventors: Chien-Liang Chen, Taoyuan County (TW); Yuan-Hui Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/205,738

(22) Filed: Aug. 9, 2011

(65) Prior Publication Data

US 2013/0038374 A1    Feb. 14, 2013

(51) Int. Cl.
*H03K 3/00* (2006.01)
(52) U.S. Cl.
USPC .......................................................... 327/108
(58) Field of Classification Search
None
See application file for complete search history.

(56) References Cited

U.S. PATENT DOCUMENTS

| | | | |
|---|---|---|---|
| 4,490,629 A | 12/1984 | Barlow et al. | |
| 4,490,829 A | 12/1984 | Van Etten | |
| 5,844,425 A | 12/1998 | Nguyen et al. | |
| 6,208,178 B1 * | 3/2001 | Chen | 327/108 |
| 6,313,661 B1 | 11/2001 | Hsu | |
| 6,803,789 B1 | 10/2004 | Yu et al. | |
| 6,927,602 B2 | 8/2005 | Ker et al. | |
| 2003/0151428 A1 | 8/2003 | OuYang | |
| 2004/0080340 A1 * | 4/2004 | Hidaka | 326/83 |

FOREIGN PATENT DOCUMENTS

TW    I290417    11/2007

OTHER PUBLICATIONS

A 3/5 V compatible I/O buffer, Marcel J. M. Pelgrom and E. Carel Dijkmans, IEEE Journal of Solid-State Circuits, vol. 30, No. 7, Jul. 1995, pp. 823-825.
Makoto Takabiashi, Takayasu Sakurai, Kazuhiro Sawada, Kazutaka Nogami, Makoto Ichida and Koji Matsuida, 3.3V-5V compatible I/O circuit without thick gate oxide, IEEE 1992 Custom Integrated Circuits Conference, 1992 IEEE,13.3.1-23.3.4.
Gajendra P. Singh, Raoul B. Salem, High-voltage-tolerant I/O buffers with low-voltage CMOS process, IEEE Journal of Solid-State Circuits, pp. 1512-1525, vol. 34, No. 11, Nov. 1999.
Deng-Yuan Chen, Design of a mixed 3.3 V and 5 V PCI I/O buffer, Compass Design Automation, pp. 336-339, San Jose, CA, U.S.A.

\* cited by examiner

*Primary Examiner* — Lincoln Donovan
*Assistant Examiner* — Khareem E Almo
(74) *Attorney, Agent, or Firm* — Ding Yu Tan

(57) ABSTRACT

A regulating circuit is used with a buffer circuit. The buffer circuit at least includes a metal-oxide-semiconductor transistor and a voltage output terminal. The voltage output terminal is connected to a drain terminal of the metal-oxide-semiconductor transistor of the buffer circuit. The regulating circuit includes a first metal-oxide-semiconductor transistor and a second metal-oxide-semiconductor transistor. The first metal-oxide-semiconductor transistor has a source terminal and a drain terminal connected to a voltage source and a connecting node, respectively. The connecting node is electrically connected to a substrate of the metal-oxide-semiconductor transistor of the buffer circuit. The second metal-oxide-semiconductor transistor has a drain terminal and a source terminal connected to the connecting node and the voltage output terminal, respectively. A substrate of the second metal-oxide-semiconductor transistor is electrically connected to the connecting node.

17 Claims, 3 Drawing Sheets

BUFFER CIRCUIT WITH REGULATING FUNCTION AND REGULATING CIRCUIT THEREOF

FIELD OF THE INVENTION

The present invention relates to a buffer circuit and a regulating circuit thereof, and more particularly to a buffer circuit having a regulating function and a regulating circuit thereof.

BACKGROUND OF THE INVENTION

As known, the large-scale electronic circuitry system (e.g. a computer system) usually contains a plurality of subsystems. For achieving normal operations of these subsystems, a lot of power supply apparatuses are needed to provide various working voltage levels. Since the large-scale electronic circuitry system can provide various working voltage levels, a mixed-voltage input/output buffer circuit is employed to smoothly transmit signals.

FIG. 1 is a schematic circuit diagram illustrating a tri-state gate circuit used in the mixed-voltage input/output buffer circuit. As shown in FIG. 1, the tri-state gate circuit is a combination of a p-channel metal-oxide-semiconductor (PMOS) transistor 11 and an n-channel metal-oxide-semiconductor (NMOS) transistor 12. The source terminal 113 and the substrate 114 of the PMOS transistor 11 are both connected to a voltage source Vdd. The drain terminal 112 of the PMOS transistor 11 and the drain terminal 122 of the NMOS transistor 12 are both connected to a voltage output terminal Vout. The source terminal 123 and the substrate 124 of the NMOS transistor 12 are both connected to a ground terminal. The voltage output terminal Vout is connected to another circuit module (not shown). If the peak value of the working voltage of the circuit module is higher than the voltage level at the voltage source Vdd, some problems possibly occur.

Please refer to FIG. 1 again. The gate terminal 111 of the PMOS transistor 11 and the gate terminal 121 of the NMOS transistor 12 are served as signal input terminals. If the voltage applied to the gate terminal 111 of the PMOS transistor 11 is higher than the voltage level Vdd, the PMOS transistor 11 should be shut off without conduction. However, if the voltage level applied to the voltage output terminal Vout by the circuit module in the working status is higher than the voltage level Vdd, the parasitic diode 115 between the drain terminal 112 and the substrate 114 of the PMOS transistor 11 is forward biased. Whereas, if the voltage level applied to the voltage output terminal Vout is higher than the voltage level Vdd to a certain extent, a leakage current flowing from the drain terminal 112 to the voltage source Vdd through the parasitic diode 115 is possibly generated. The leakage current results in undesirable power consumption and device damage. Therefore, there is a need of providing an improved buffer circuit to obviate the drawbacks.

SUMMARY OF THE INVENTION

In accordance with an aspect, the present invention provides a regulating circuit for use with a buffer circuit. The buffer circuit at least includes a metal-oxide-semiconductor transistor and a voltage output terminal. The voltage output terminal is connected to a drain terminal of the metal-oxide-semiconductor transistor of the buffer circuit. The regulating circuit includes a first metal-oxide-semiconductor transistor and a second metal-oxide-semiconductor transistor. The first metal-oxide-semiconductor transistor has a source terminal and a drain terminal connected to a voltage source and a connecting node, respectively. The connecting node is electrically connected to a substrate of the metal-oxide-semiconductor transistor of the buffer circuit. The second metal-oxide-semiconductor transistor has a drain terminal and a source terminal connected to the connecting node and the voltage output terminal, respectively. A substrate of the second metal-oxide-semiconductor transistor is electrically connected to the connecting node.

In an embodiment, the first metal-oxide-semiconductor transistor is an n-channel metal-oxide-semiconductor transistor, and the second metal-oxide-semiconductor transistor is a p-channel metal-oxide-semiconductor transistor, wherein a substrate of the first metal-oxide-semiconductor transistor is connected to a ground terminal.

In an embodiment, the first metal-oxide-semiconductor transistor and the second metal-oxide-semiconductor transistors are p-channel metal-oxide-semiconductor transistors, which have substrates respectively connected to the connecting node.

In an embodiment, the regulating circuit further includes a first inverter and a second inverter. An input end of the first inverter is electrically connected to the voltage source. A gate terminal of the first metal-oxide-semiconductor transistor is connected to an output end of the inverter. An input end of the second inverter is electrically connected to the voltage output terminal. A gate terminal of the second metal-oxide-semiconductor transistor is connected to an output end of the second inverter.

In an embodiment, the metal-oxide-semiconductor transistor of the buffer circuit and the second metal-oxide-semiconductor transistor of the regulating circuit are p-channel metal-oxide-semiconductor transistors and have a common N-well region.

In an embodiment, a main part of the buffer circuit is a tri-state gate circuit.

In an embodiment, a gate terminal of the first metal-oxide-semiconductor transistor and a gate terminal of the second metal-oxide-semiconductor transistor are both electrically to the voltage source.

In an embodiment, the regulating circuit further includes an inverter. An input end of the inverter is electrically connected to the voltage output terminal, and a gate terminal of the first metal-oxide-semiconductor transistor and a gate terminal of the second metal-oxide-semiconductor transistor are both electrically to an output end of the second inverter.

In accordance with another aspect, the present invention provides a buffer circuit with a regulating function. The buffer circuit is connected between a voltage source and an external circuit. The buffer circuit includes a buffer circuit main part, a first metal-oxide-semiconductor transistor and a second metal-oxide-semiconductor transistor. The buffer circuit main part at least includes a metal-oxide-semiconductor transistor and a voltage output terminal. The voltage output terminal is connected between a drain terminal of the metal-oxide-semiconductor transistor and the external circuit. The first metal-oxide-semiconductor transistor has a source terminal and a drain terminal connected to the voltage source and a connecting node, respectively. The connecting node is electrically connected to a substrate of the metal-oxide-semiconductor transistor of the buffer circuit main part. The second metal-oxide-semiconductor transistor has a drain terminal and a source terminal connected to the connecting node and the voltage output terminal, respectively. A substrate of the second metal-oxide-semiconductor transistor is electrically connected to the connecting node.

In accordance with a further aspect, the present invention provides a buffer circuit with a regulating function. The buffer circuit is connected between a voltage source and an external circuit. The buffer circuit includes a buffer circuit main part and a regulating circuit. The buffer circuit main part at least includes a metal-oxide-semiconductor transistor and a voltage output terminal. The voltage output terminal is connected between a drain terminal of the metal-oxide-semiconductor transistor and the external circuit. The regulating circuit is electrically connected to the voltage source, the voltage output terminal and a connecting node. The connecting node is electrically connected to a substrate of the metal-oxide-semiconductor transistor of the buffer circuit main part. A larger one of a voltage level at the voltage source and a voltage level at the voltage output terminal is outputted from the regulating circuit to the connecting node, so that a voltage level at the substrate of the metal-oxide-semiconductor transistor of the buffer circuit main part is correspondingly regulated.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
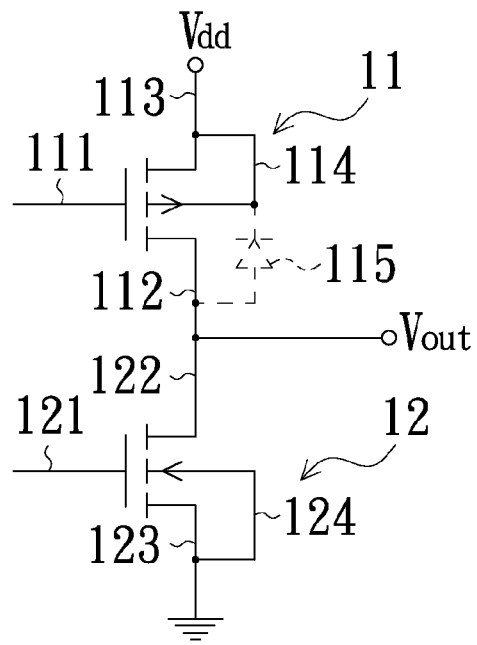
FIG. 1 is a schematic circuit diagram illustrating a tri-state gate buffer used in the mixed-voltage input/output buffer circuit.
Figure 2:
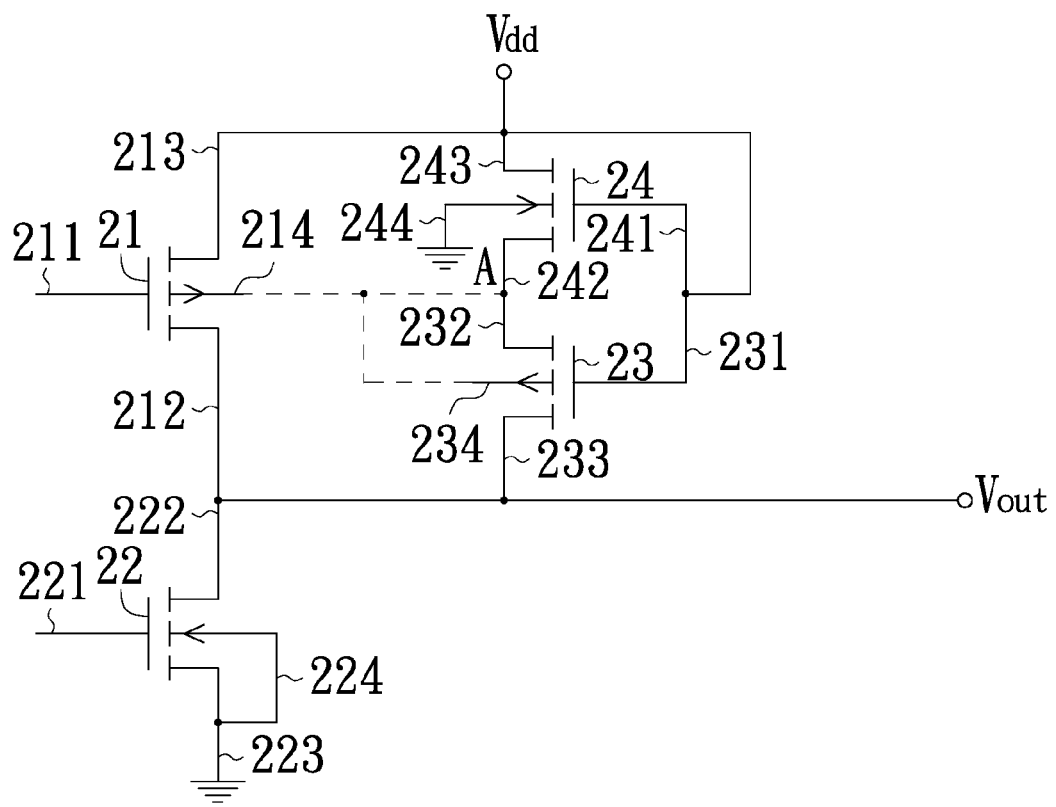
FIG. 2 is a schematic circuit diagram illustrating a buffer circuit according to an embodiment of the present invention.

FIG. 2 is a schematic circuit diagram illustrating a buffer circuit according to an embodiment of the present invention. As shown in FIG. 2, the buffer circuit main part comprises a p-channel metal-oxide-semiconductor (PMOS) transistor 21 and an n-channel metal-oxide-semiconductor (NMOS) transistor 22. The source terminal 213 of the PMOS transistor 21 is connected to a voltage source Vdd. The drain terminal 212 of the PMOS transistor 21 and the drain terminal 222 of the NMOS transistor 22 are both connected to a voltage output terminal Vout. The source terminal 223 and the substrate 224 of the NMOS transistor 22 are both connected to a ground terminal. In this embodiment, the buffer circuit main part is a tri-state gate circuit.

Moreover, the buffer circuit further comprises another p-channel metal-oxide-semiconductor (PMOS) transistor 23 and another n-channel metal-oxide-semiconductor (NMOS) transistor 24. The PMOS transistor 23 and the NMOS transistor 24 are collectively defined as a regulating circuit. In an embodiment, the NMOS transistor 24 has a normal threshold voltage or zero threshold voltage. For example, the NMOS transistor 24 is a NVT transistor. The gate terminal 231 of the PMOS transistor 23 and the gate terminal 241 and the source terminal 243 of the NMOS transistor 24 are all connected to the voltage source Vdd. The drain terminal 232 of the PMOS transistor 23 and the drain terminal 242 of the NMOS transistor 24 are both connected to a connecting node A. Moreover, as indicated in the dotted line, the connecting node A between the drain terminal 232 of the PMOS transistor 23 and the drain terminal 242 of the NMOS transistor 24, the substrate 214 of the PMOS transistor 21 and the substrate 234 of the PMOS transistor 23 have a common N-well region. The substrate 244 of the NMOS transistor 24 is connected to a ground terminal. The source terminal 233 of the PMOS transistor 23 is connected to the voltage output terminal Vout.

If the voltage applied to the voltage output terminal Vout is higher than the voltage level at the voltage source Vdd, the PMOS transistor 23 is conducted, but the NMOS transistor 24 is shut off. Under this circumstance, the voltage level at the connecting node A between the drain terminals 232 and 242 reaches the voltage level at the voltage output terminal Vout. Since the connecting node A is connected to the substrate 214 of the PMOS transistor 21, the voltage level at the substrate 214 is equal to the voltage level at the voltage output terminal Vout. In this situation, the voltage level at the substrate 214 is equal to the voltage level at the drain 212 of the PMOS transistor 21. Consequently, the parasitic diode between the drain terminal 212 and the substrate 214 of the PMOS transistor 21 is not forward biased, and the possibility of generating the leakage current is eliminated.

Whereas, if the voltage applied to the voltage output terminal Vout is lower than the voltage level at the voltage source Vdd, the PMOS transistor 23 is shut off but the NMOS transistor 24 is conducted. Under this circumstance, the voltage level at the connecting node A between the drain terminals 232 and 242 reaches the voltage level at the voltage source Vdd. Since the connecting node A is connected to the substrate 214 of the PMOS transistor 21, the voltage level at the substrate 214 is equal to the voltage level at the voltage source Vdd. In this situation, the voltage level at the substrate 214 is higher than the voltage level at the drain 212 of the PMOS transistor 21. Consequently, the parasitic diode between the drain terminal 212 and the substrate 214 of the PMOS transistor 21 is not forward biased, and the possibility of generating the leakage current is eliminated.

Figure 3:
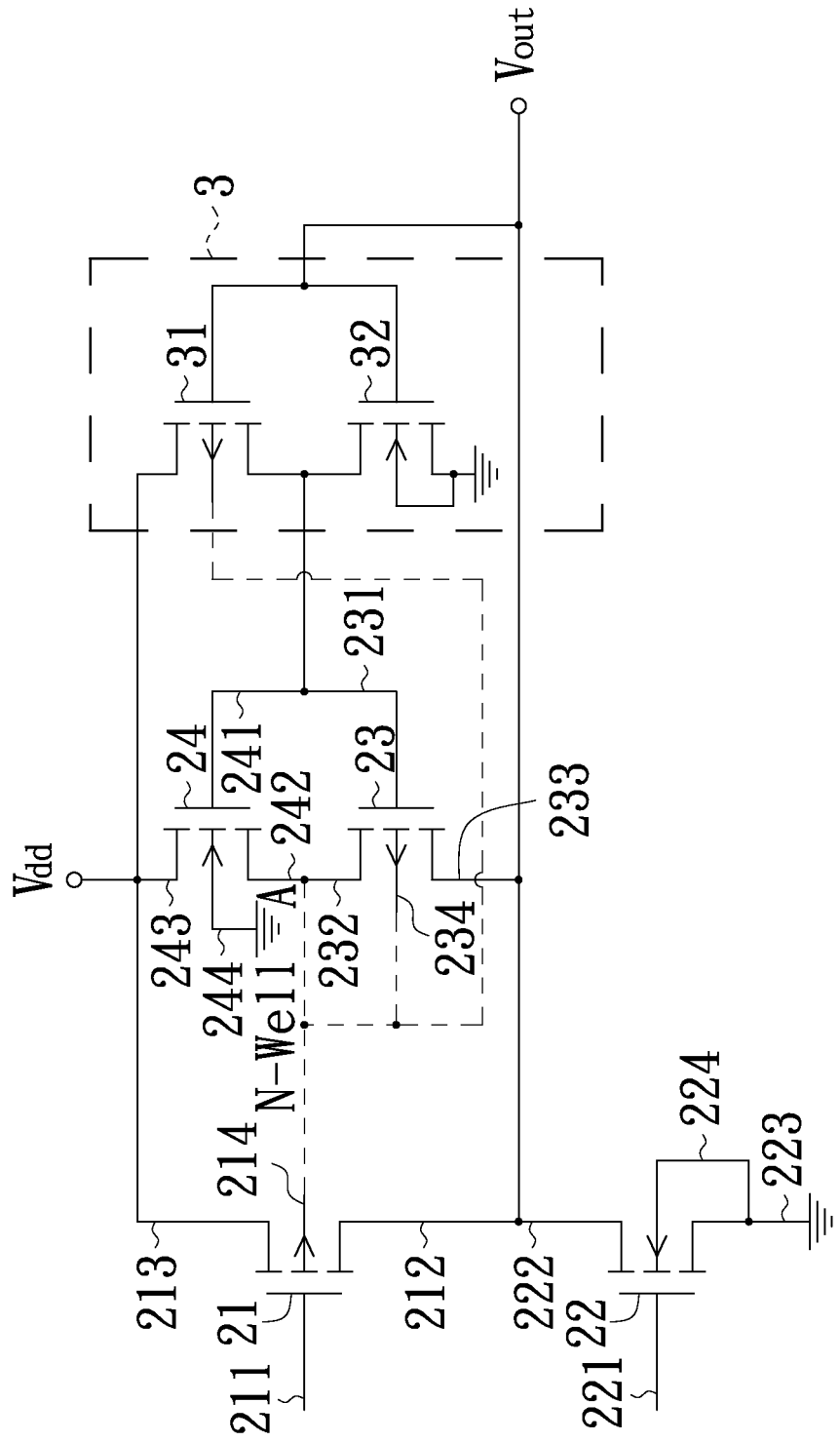
FIG. 3 is a schematic circuit diagram illustrating a buffer circuit according to another embodiment of the present invention.

FIG. 3 is a schematic circuit diagram illustrating a buffer circuit according to another embodiment of the present invention. As previously described in FIG. 2, the control voltage applied to the gate terminal 231 of the PMOS transistor 23 and the gate terminal 241 of the NMOS transistor 24 is provided by the voltage source Vdd. Whereas, in this embodiment, the control voltage applied to the gate terminal 231 of the PMOS transistor 23 and the gate terminal 241 of the NMOS transistor 24 is an inverted voltage, wherein the voltage level at the voltage output terminal Vout is inverted into the inverted voltage by an inverter 23. That is, the buffer circuit of this embodiment further comprises an inverter 3 for providing the control voltage. In this embodiment, the inverter 3 is a combination of a PMOS transistor 31 and an NMOS transistor 32. An input end of the inverter 3 is connected to the voltage output terminal Vout. An output end of the inverter 3 is connected to the gate terminal 231 of the PMOS transistor 23 and the gate terminal 241 of the NMOS transistor 24.

If the voltage applied to the voltage output terminal Vout is higher than the voltage level at the voltage source Vdd, the PMOS transistor 23 is conducted, but the NMOS transistor 24 is shut off. Under this circumstance, the voltage level at the connecting node A between the drain terminals 232 and 242 reaches the voltage level at the voltage output terminal Vout. In this situation, the voltage level at the substrate 214 is equal to the voltage level at the drain 212 of the PMOS transistor 21. Consequently, the parasitic diode between the drain terminal 212 and the substrate 214 of the PMOS transistor 21 is not forward biased, and the possibility of generating the leakage current is eliminated.

Whereas, if the voltage applied to the voltage output terminal Vout is lower than the voltage level at the voltage source Vdd, the PMOS transistor 23 is shut off but the NMOS transistor 24 is conducted. Under this circumstance, the voltage level at the connecting node A between the drain terminals 232 and 242 reaches the voltage level at the voltage source Vdd. Since the connecting node A is connected to the substrate 214 of the PMOS transistor 21, the voltage level at the substrate 214 is equal to the voltage level at the voltage source Vdd. In this situation, the voltage level at the substrate 214 is higher than the voltage level at the drain 212 of the PMOS transistor 21. Consequently, the parasitic diode between the drain terminal 212 and the substrate 214 of the PMOS transistor 21 is not forward biased, and the possibility of generating the leakage current is eliminated.

Moreover, since the control voltage applied to the gate terminal 231 of the PMOS transistor 23 and the gate terminal 241 of the NMOS transistor 24 is the inverted voltage processed by the inverter 3, the switching speed of the gate terminal 231 of the PMOS transistor 23 and the gate terminal 241 of the NMOS transistor 24 will be enhanced.

In the above two embodiments, the voltage level at the connecting node A is equal to either the voltage level Vout or the voltage level Vdd even if the system is operated in the power-saving mode (e.g. the he voltage level Vdd is zero). Consequently, the problem of causing the leakage current will be avoided.

Figure 4:
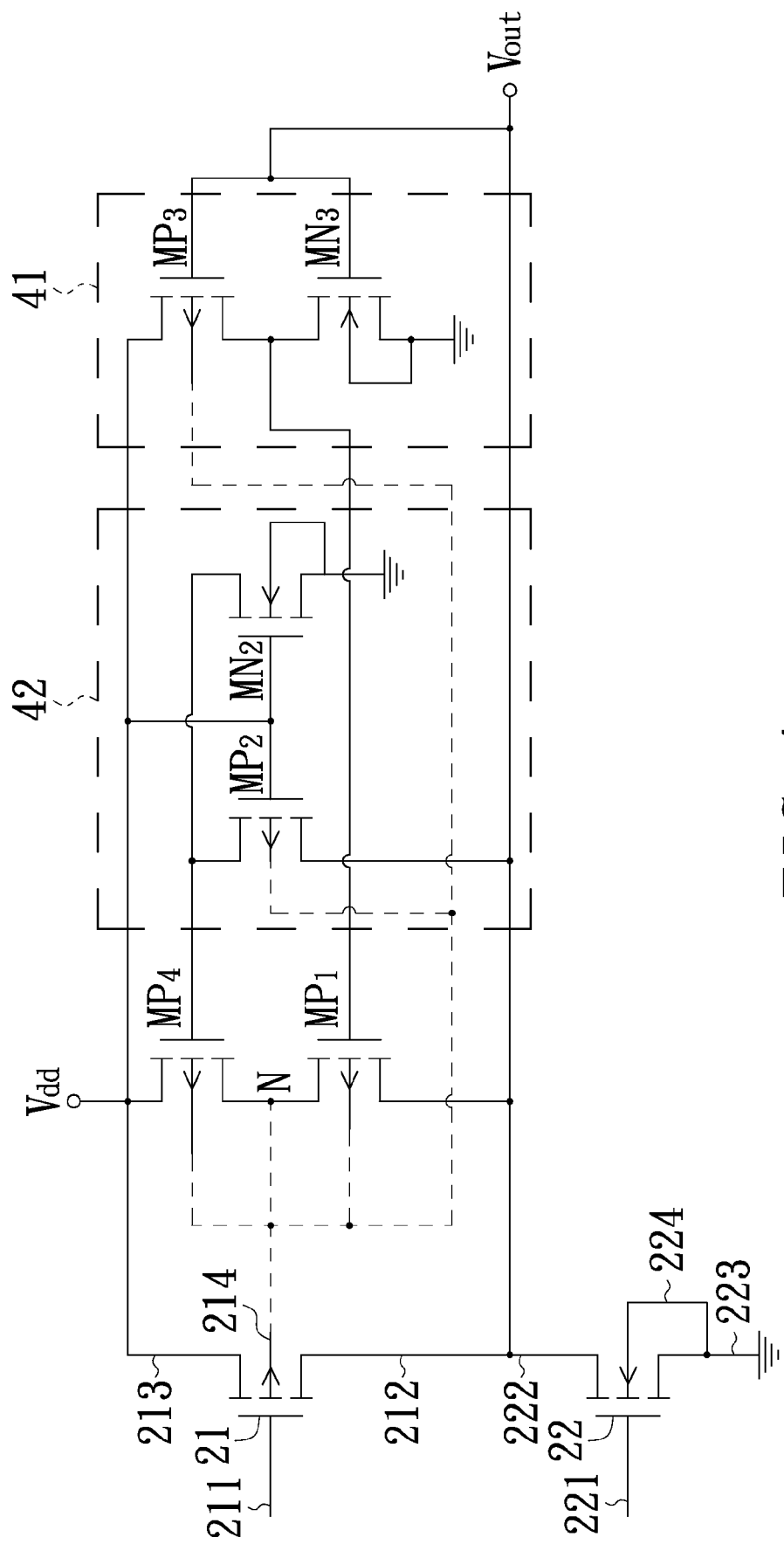
FIG. 4 is a schematic circuit diagram illustrating a buffer circuit according to a further embodiment of the present invention.

FIG. 4 is a schematic circuit diagram illustrating a buffer circuit according to a further embodiment of the present invention. The buffer circuit of FIG. 4 further comprises two serially-connected PMOS transistors MP4 and MP1. A terminal of the transistor MP4 is connected to the voltage source Vdd. A terminal of the transistor MP1 is connected to the voltage output terminal Vout. Moreover, the transistors MP4 and MP1 are collectively connected to a connecting node N. Moreover, as indicated in the dotted line, the connecting node N, the substrate 214 of the PMOS transistor 21 and the substrates of the transistors MP4 and MP1 have a common N-well region.

In this embodiment, the NMOS transistor 24 as shown in the buffer circuit of FIG. 3 is replaced by the PMOS transistor MP4. For achieving the benefits similar to the buffer circuit of FIG. 3, the control voltage applied to the gate of the PMOS transistor MP4 should be changed. In this embodiment, the buffer circuit further comprises two inverters 41 and 42. The inverter 41 is a combination of a PMOS transistor MP2 and an NMOS transistor MN2. By the inverter 41, the voltage level at the voltage source Vdd is inverted into an inverted voltage, which is transmitted to the PMOS transistor MP4 and served as a control voltage. The inverter 42 is a combination of a PMOS transistor MP3 and an NMOS transistor MN3. The function of the inverter 42 is similar to that of the inverter 3 as shown in FIG. 3, and is not redundantly described herein.

If the voltage applied to the voltage output terminal Vout is higher than the voltage level at the voltage source Vdd, the PMOS transistor MP1 is conducted, but the PMOS transistor MP4 is shut off. Under this circumstance, the voltage level at the connecting node N reaches the voltage level at the voltage output terminal Vout. Whereas, if the voltage applied to the voltage output terminal Vout is lower than the voltage level at the voltage source Vdd, the PMOS transistor MP1 is shut off, but the PMOS transistor MP4 is conducted. Under this circumstance, the voltage level at the connecting node A reaches the voltage level at the voltage source Vdd. In such way, the voltage level at the connecting node N is equal to the larger one of the voltage level Vout and the voltage level Vdd. Consequently, the problem of causing the leakage current will be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A regulating circuit for use with a buffer circuit, the buffer circuit at least comprising a metal-oxide-semiconductor transistor and a voltage output terminal, the voltage output terminal being connected to a drain terminal of the metal-oxide-semiconductor transistor, the regulating circuit comprising:

a first metal-oxide-semiconductor transistor having a gate terminal, a source terminal and a drain terminal connected to a voltage source and a connecting node, respectively, wherein the connecting node is electrically connected to a substrate of the metal-oxide-semiconductor transistor of the buffer circuit; and a second metal-oxide-semiconductor transistor having a gate terminal, a drain terminal and a source terminal connected to the connecting node and the voltage output terminal, respectively, wherein a substrate of the second metal-oxide-semiconductor transistor is electrically connected to the connecting node, wherein the gate terminals of the first metal-oxide-semiconductor transistor and the second metal-oxide-semiconductor transistor are directly connected together.

2. The regulating circuit according to claim 1, wherein the first metal-oxide-semiconductor transistor is an n-channel metal-oxide-semiconductor transistor, and the second metal-oxide-semiconductor transistor is a p-channel metal-oxide-semiconductor transistor, wherein a substrate of the first metal-oxide-semiconductor transistor is connected to a ground terminal.

3. A regulating circuit for use with a buffer circuit, the buffer circuit at least comprising a metal-oxide-semiconductor transistor and a voltage output terminal, the voltage output terminal being connected to a drain terminal of the metal-oxide-semiconductor transistor, the regulating circuit comprising:

a first metal-oxide-semiconductor transistor having a source terminal and a drain terminal connected to a voltage source and a connecting node, respectively, wherein the connecting node is electrically connected to a substrate of the metal-oxide-semiconductor transistor of the buffer circuit; and a second metal-oxide-semiconductor transistor having a drain terminal and a source terminal connected to the connecting node and the voltage output terminal, respectively, wherein a substrate of the second metal-oxide-semiconductor transistor is electrically connected to the connecting node, wherein the first metal-oxide-semiconductor transistor and the second metal-oxide-semiconductor transistors are p-channel metal-oxide-semiconductor transistors, which have substrates respectively connected to the connecting node.

4. The regulating circuit according to claim 3, further comprising:
a first inverter, wherein an input end of the first inverter is electrically connected to the voltage source, and a gate terminal of the first metal-oxide-semiconductor transistor is connected to an output end of the inverter; and
a second inverter, wherein an input end of the second inverter is electrically connected to the voltage output terminal, and a gate terminal of the second metal-oxide-semiconductor transistor is connected to an output end of the second inverter.

5. The regulating circuit according to claim 1, wherein the metal-oxide-semiconductor transistor of the buffer circuit and the second metal-oxide-semiconductor transistor of the regulating circuit are p-channel metal-oxide-semiconductor transistors and have a common N-well region.

6. The regulating circuit according to claim 1, wherein a main part of the buffer circuit is a tri-state gate circuit.

7. The regulating circuit according to claim 1, wherein the gate terminal of the first metal-oxide-semiconductor transistor and the gate terminal of the second metal-oxide-semiconductor transistor are both electrically connected to the voltage source.

8. The regulating circuit according to claim 1, further comprising an inverter, wherein an input end of the inverter is electrically connected to the voltage output terminal, and the gate terminal of the first metal-oxide-semiconductor transistor and the gate terminal of the second metal-oxide-semiconductor transistor are both electrically to an output end of the second inverter.

9. A buffer circuit with a regulating function, the buffer circuit being connected between a voltage source and an external circuit, the buffer circuit comprising:
a buffer circuit main part at least comprising a metal-oxide-semiconductor transistor and a voltage output terminal, wherein the voltage output terminal is connected between a drain terminal of the metal-oxide-semiconductor transistor and the external circuit;
a first metal-oxide-semiconductor transistor having a gate terminal, a source terminal and a drain terminal connected to the voltage source and a connecting node, respectively, wherein the connecting node is electrically connected to a substrate of the metal-oxide-semiconductor transistor of the buffer circuit main part; and
a second metal-oxide-semiconductor transistor having a gate terminal, a drain terminal and a source terminal connected to the connecting node and the voltage output terminal, respectively, wherein a substrate of the second metal-oxide-semiconductor transistor is electrically connected to the connecting node, wherein the gate terminals of the first metal-oxide-semiconductor transistor and the second metal-oxide-semiconductor transistor are directly connected together.

10. The buffer circuit according to claim 9, wherein the first metal-oxide-semiconductor transistor is an n-channel metal-oxide-semiconductor transistor, and the second metal-oxide-semiconductor transistor is a p-channel metal-oxide-semiconductor transistor, wherein a substrate of the first metal-oxide-semiconductor transistor is connected to a ground terminal.

11. A buffer circuit with a regulating function, the buffer circuit being connected between a voltage source and an external circuit, the buffer circuit comprising:
a buffer circuit main part at least comprising a metal-oxide-semiconductor transistor and a voltage output terminal, wherein the voltage output terminal is connected between a drain terminal of the metal-oxide-semiconductor transistor and the external circuit;
a first metal-oxide-semiconductor transistor having a source terminal and a drain terminal connected to the voltage source and a connecting node, respectively, wherein the connecting node is electrically connected to a substrate of the metal-oxide-semiconductor transistor of the buffer circuit main part; and
a second metal-oxide-semiconductor transistor having a drain terminal and a source terminal connected to the connecting node and the voltage output terminal, respectively, wherein a substrate of the second metal-oxide-semiconductor transistor is electrically connected to the connecting node, wherein the first metal-oxide-semiconductor transistor and the second metal-oxide-semiconductor transistors are p-channel metal-oxide-semiconductor transistors, which have substrates respectively connected to the connecting node.

12. The buffer circuit according to claim 11, further comprising:
a first inverter, wherein an input end of the first inverter is electrically connected to the voltage source, and a gate terminal of the first metal-oxide-semiconductor transistor is connected to an output end of the inverter; and
a second inverter, wherein an input end of the second inverter is electrically connected to the voltage output terminal, and a gate terminal of the second metal-oxide-semiconductor transistor is connected to an output end of the second inverter.

13. The buffer circuit according to claim 9, wherein the metal-oxide-semiconductor transistor of the buffer circuit main part and the second metal-oxide-semiconductor transistor are p-channel metal-oxide-semiconductor transistors and have a common N-well region.

14. The buffer circuit according to claim 9, wherein the buffer circuit main part is a tri-state gate circuit.

15. The buffer circuit according to claim 9, wherein the gate terminal of the first metal-oxide-semiconductor transistor and the gate terminal of the second metal-oxide-semiconductor transistor are both electrically to the voltage source.

16. The buffer circuit according to claim 9, further comprising an inverter, wherein an input end of the inverter is electrically connected to the voltage output terminal, and the gate terminal of the first metal-oxide-semiconductor transistor and the gate terminal of the second metal-oxide-semiconductor transistor are both electrically to an output end of the second inverter.

17. A buffer circuit with a regulating function, the buffer circuit being connected between a voltage source and an external circuit, the buffer circuit comprising:
a buffer circuit main part at least comprising a metal-oxide-semiconductor transistor and a voltage output terminal, wherein the voltage output terminal is connected between a drain terminal of the metal-oxide-semiconductor transistor and the external circuit; and
a regulating circuit electrically connected to the voltage source, the voltage output terminal and a connecting node, wherein the connecting node is electrically connected to a substrate of the metal-oxide-semiconductor transistor of the buffer circuit main part, wherein a larger one of a voltage level at the voltage source and a voltage level at the voltage output terminal is outputted from the regulating circuit to the connecting node, so that a voltage level at the substrate of the metal-oxide-semiconductor transistor of the buffer circuit main part is correspondingly regulated.

* * * * *